United States Patent …

(12) United States Patent
Wang et al.

(10) Patent No.: US 8,924,602 B2
(45) Date of Patent: Dec. 30, 2014

(54) RACK SERVER WITH A GROUND ELEMENT HAVING A PLURALITY OF PROTRUSIONS FOR INTERCONNECTING A PLURALITY OF POWER SUPPLY BACKPLANES

(71) Applicants: Inventec (Pudong) Technology Corporation, Shanghai (CN); Inventec Corporation, Taipei (TW)

(72) Inventors: Shu-Yen Wang, Taipei (TW); Hao-Yen Kuan, Taipei (TW); Yo-Cheng Lin, Taipei (TW)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 52 days.

(21) Appl. No.: 13/844,925

(22) Filed: Mar. 16, 2013

(65) Prior Publication Data

US 2014/0118914 A1 May 1, 2014

(30) Foreign Application Priority Data

Oct. 31, 2012 (CN) .......................... 2012 1 0426594

(51) Int. Cl.
*G06F 13/00* (2006.01)
*G06F 11/00* (2006.01)
*G06F 11/22* (2006.01)

(52) U.S. Cl.
USPC .......... 710/15; 710/8; 710/9; 710/10; 710/16; 710/17; 710/18; 710/19; 710/14; 713/300; 713/330; 714/27; 714/30

(58) Field of Classification Search
USPC ...................... 710/8–10, 14–19; 713/300, 330
See application file for complete search history.

(56) References Cited

U.S. PATENT DOCUMENTS

| | | | | |
|---|---|---|---|---|
| 5,948,075 | A * | 9/1999 | Osten | 710/8 |
| 6,681,342 | B2 * | 1/2004 | Johnson et al. | 714/30 |
| 7,294,980 | B2 * | 11/2007 | Ma et al. | 318/49 |
| 8,826,078 | B2 * | 9/2014 | Chou et al. | 714/27 |

* cited by examiner

*Primary Examiner* — Tammara Peyton
(74) *Attorney, Agent, or Firm* — Morris Manning & Martin LLP; Tim Tingkang Xia, Esq.

(57) ABSTRACT

A rack server includes multiple power supply backplanes and multiple Fan Controller Boards (FCBs). The power supply backplanes each have a connection unit. The connection unit has multiple connection terminals. One of the connection terminals is coupled to a ground terminal. Positions of the connection terminals of the connection units coupled to the ground terminal are different from each other. The FCBs are coupled to one of the corresponding power supply backplanes respectively. The FCBs each include an addressing circuit and a microcontroller. The addressing circuit is coupled to the connection terminals of the corresponding connection unit, and is used to generate an address signal by detecting and according to a coupling relationship between the connection terminals and the ground terminal. The microcontroller is coupled to the addressing circuit, and is used to receive the address signal, so as to generate corresponding address information.

5 Claims, 3 Drawing Sheets

RACK SERVER WITH A GROUND ELEMENT HAVING A PLURALITY OF PROTRUSIONS FOR INTERCONNECTING A PLURALITY OF POWER SUPPLY BACKPLANES

CROSS-REFERENCE TO RELATED APPLICATIONS

This non-provisional application claims priority under 35 U.S.C. §119(a) on Patent Application No(s). 201210426594.3 filed in China P.R.C. on Oct. 31, 2012, the entire contents of which are hereby incorporated by reference.

BACKGROUND OF THE INVENTION

1. Technical Field of the Invention

The disclosure relates to a server, and more particularly to a rack server configured for providing an addressing operation.

2. Description of the Related Art

Generally, in the framework of a rack server, a plurality of Fan Controller Boards (FCBs) are arranged to control operations of corresponding fans, so as to perform heat dissipation on the rack server. Furthermore, the plurality of FCBs are connected to, for example, a Rack Management Controller (RMC). In order to perform management in a unified manner, the RMC accesses information of each of the plurality of FCBs. In other words, a user may control the operation of the plurality of FCBs through the RMC.

However, the plurality of FCBs are required to be modularized in order to meet requirements on costs. That is, the design of all FCBs in a rack server is required to be the same. Nonetheless, given that both hardware addressing and software addressing cannot be achieved when the plurality of FCBs are modularized, the RMC is unable to know a corresponding position of each FCB in the rack server.

In other words, when a certain FCB is abnormal or faulty, the RMC cannot determine accurately which FCB is abnormal or faulty. Hence, the user is unable to know which FCB is faulty immediately. As a result, corresponding processing cannot be performed, which incurs inconvenience of use, management and subsequent processing in terms of operating the rack server.

SUMMARY OF THE INVENTION

An embodiment of the disclosure provides a rack server comprising a plurality of power supply backplanes and a plurality of FCBs. The plurality of power supply backplanes each have a connection unit. The connection unit has a plurality of connection terminals. One of the plurality of connection terminals is coupled to a ground terminal. Positions of the plurality of connection terminals of the connection units coupled to the ground terminal are different from each other. The plurality of FCBs are coupled to one of the corresponding power supply backplanes respectively. The plurality of FCBs each comprise an addressing circuit and a microcontroller. The addressing circuit is coupled to the plurality of connection terminals of the corresponding connection unit, and is configured for detecting a coupling relationship between the plurality of connection terminals and the ground terminal, so as to generate an address signal upon the coupling relationship between the plurality of connection terminals and the ground terminal. The microcontroller is coupled to the addressing circuit, and is configured for receiving the address signal, so as to generate corresponding address information.

Another embodiment of the disclosure provides a rack server comprising a ground element, a plurality of power supply backplanes, and a plurality of Fan Controller Boards (FCBs). The ground element has a plurality of protrusions. The protrusions are arranged on a same side of the ground element, and positions of the protrusions are different from each other. The plurality of power supply backplanes each has a connection unit. The connection unit has a plurality of connection terminals. The plurality of connection terminals each has a through hole. Each of the power supply backplanes is coupled to the ground element. One of the plurality of through holes of the plurality of connection terminals contacts one of the plurality of protrusions. Each of the plurality of FCBs is configured for being coupled to one of the power supply backplanes and comprises an addressing circuit and a microcontroller. The addressing circuit is coupled to the plurality of connection terminals of the corresponding connection unit. The addressing circuit is configured for detecting a coupling relationship between the plurality of connection terminals and the ground element, so as to generate an address signal upon the coupling relationship between the plurality of connection terminals and the ground element. The microcontroller is coupled to the addressing circuit, and is configured for receiving the address signal, so as to generate corresponding address information

BRIEF DESCRIPTION OF THE DRAWINGS

The disclosure will become more fully understood from the detailed description given herein below for illustration only, and thus does not limit the disclosure, wherein.

DETAILED DESCRIPTION

Figure 1:
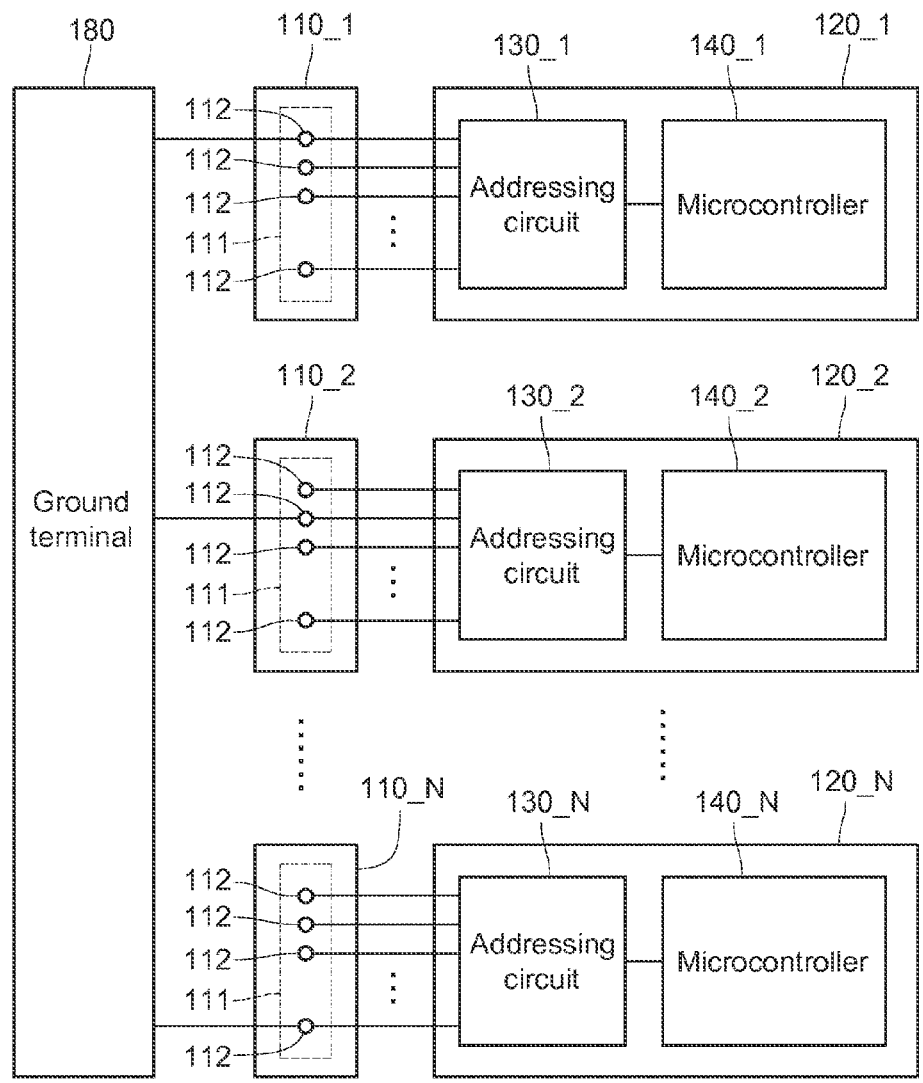
FIG. 1 is a schematic view of a rack server according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the following embodiments, the same reference numerals are used to represent the same or similar elements.

Referring to FIG. 1, FIG. 1 is a schematic view of a rack server according to the disclosure. A rack server 100 comprises a plurality of power supply backplanes 110_1~110_N and a plurality of FCBs 120_1~120_N, where N is a positive integer greater than 1. In this embodiment, the number of the power supply backplanes corresponds to the number of the plurality of FCBs. For example, when the number of the power supply backplanes is 3, the number of the plurality of FCBs is also 3; when the number of the power supply backplanes is 5, the number of the plurality of FCBs is also 5; and so forth.

The power supply backplanes 110_1~110_N each have a connection unit 111. The connection unit 111 has a plurality of connection terminals 112. One of the plurality of connection terminals 112 is coupled to a ground terminal 180. Positions of the plurality of connection terminals 112 of the connection units 111 coupled to the ground terminal 180 are different from each other. The number of the plurality of connection terminals 112 also corresponds to the number of the power supply backplanes 110_1~110_N. For example, when the number of the power supply backplanes is 3, the number of the plurality of connection terminals 112 is also 3; when the number of the power supply backplanes is 5, the number of the plurality of connection terminals 112 is also 5.

Moreover, arrangement positions and the number of the plurality of connection terminals 112 of the connection unit 111 of each of the power supply backplanes 110_1~110_N are the same, as shown in FIG. 1. However, the arrangement positions of the plurality of connection terminals in FIG. 1 are only an implementation aspect of the disclosure. Therefore, in this embodiment and some other embodiments, a user changes the arrangement positions of the plurality of connection terminals according to needs.

In this embodiment, a first connection terminal 112 of the connection unit 111 of the power supply backplane 110_1 is coupled to the ground terminal 180. The other connection terminals 112 are floating; a second connection terminal of the connection unit 111 of the power supply backplane 110_2 is coupled to the ground terminal 180, and the other connection terminals 112 are floating; . . . ; an $N^{th}$ connection terminal of the connection unit 111 of the power supply backplane 110_N is coupled to the ground terminal 180, and the other connection terminals 112 are floating.

Figure 2:
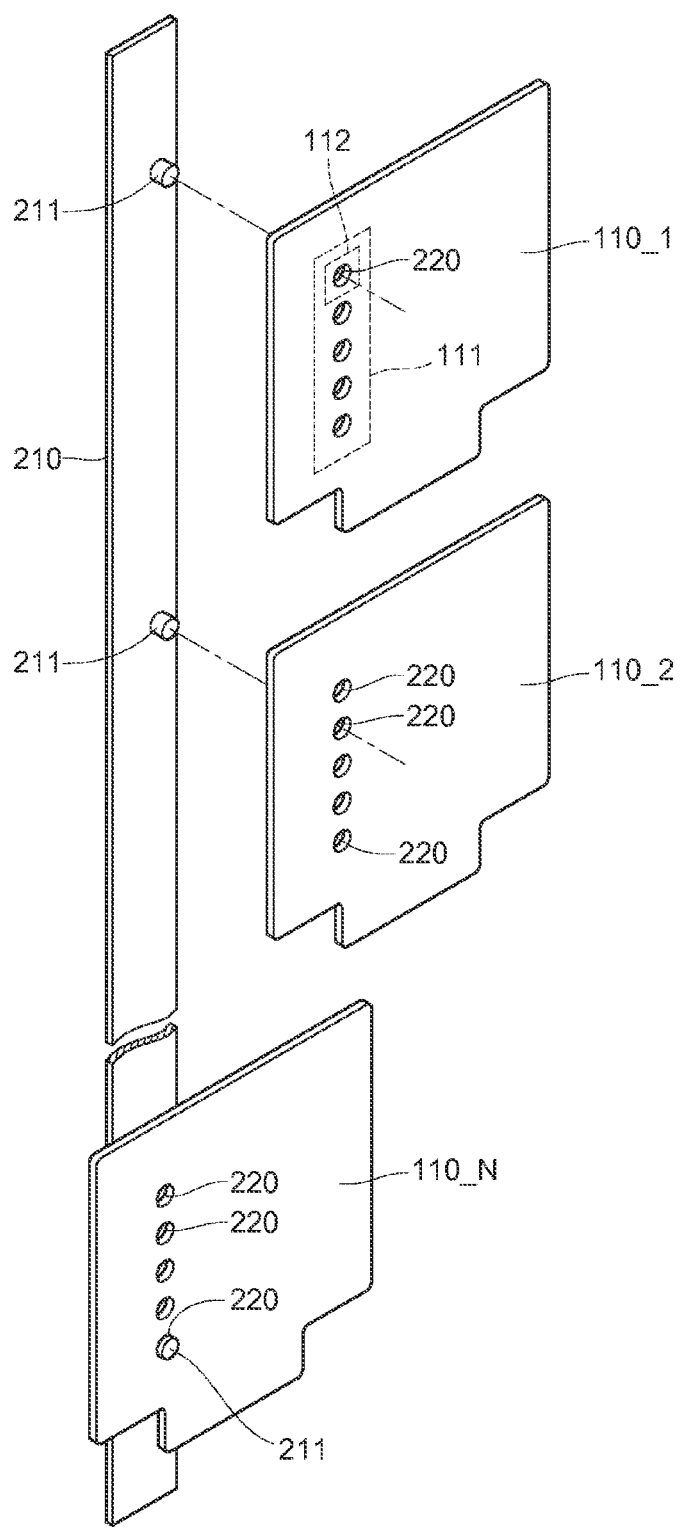
FIG. 2 is a perspective view of correspondence between a ground element and power supply backplanes according to the disclosure.

Specifically, in this embodiment and some other embodiments, the ground terminal 180 is a ground element 210, as shown in FIG. 2. Referring to FIG. 2, FIG. 2 is a perspective view of correspondence between a ground element and power supply backplanes according to the disclosure. For convenience of illustration, in FIG. 2, only 5 protrusions 211 are shown, and only 5 through holes 220 are shown, but the disclosure is not limited thereto. In this embodiment and some other embodiments, the user adjusts the number of the protrusions 211 and the number of the through holes 220 if needed.

The ground element 210 has a plurality of protrusions 211. The protrusions 211 are arranged on a same side of the ground element 210 (as shown in FIG. 2). In addition, positions of the protrusions 211 are different from each other.

Furthermore, the plurality of connection terminals 112 of the connection unit 111 of each of the power supply backplanes 110_1~110_N each have a through hole 220. Therefore, when the power supply backplanes 110_1~110_N are coupled to the ground element 210 (namely, the ground terminal 180), one of the through holes 220 of the plurality of connection terminals 112 contacts (for example, is engaged with) the protrusion 211 in the corresponding position on the ground element 210 (namely, the ground terminal 180). In this embodiment, the signal level of the connection terminal 112 that contacts (is engaged with) the ground element 210 (namely, the ground terminal 180) through the through hole 220 is a low logic level. In this embodiment, the signal levels of the other connection terminals 112 that do not contact (are not engaged with) the ground element 210 (namely, the ground terminal 180) through the through holes 220 are high logic levels.

In an embodiment, the ground terminal 180 (that is, the ground element 210) is a housing of the rack server 100. In another embodiment, the ground terminal 180 (that is, the ground element 210) is a ground portion of a power supply unit of the rack server 100. That is, the ground terminal 180 (namely, the ground element 210) is, for example, the ground of a power supply or a ground portion of a strip-shaped power supply unit (a power bus bar).

Referring to FIG. 1, the plurality of FCBs 120_1~120_N are coupled to one of the corresponding power supply backplanes 110_1~110_N respectively. In this embodiment, the plurality of FCBs 120_1~120_N are coupled to the corresponding power supply backplanes 110_1~110_N in a one-to-one manner. Specifically, for example, the FCB 120_1 is coupled to the power supply backplane 110_1, the FCB 120_2 is coupled to the power supply backplane 110_2, . . . , and the FCB 120_N is coupled to the power supply backplane 110_N.

The plurality of FCBs 120_1~120_N comprise addressing circuits 130_1~130_N and microcontrollers 140_1~140_N respectively. The addressing circuits 130_1~130_N are respectively used to provide corresponding address signals by detecting and according to coupling relationships between the plurality of connection terminals 112 of the connection units 111 of the power supply backplanes 110_1~110_N and the ground terminal 180 (for example, to detect a contact status between the through holes 220 on the plurality of connection terminals 112 and the protrusions 211 of the ground element 210 shown in FIG. 2). The microcontrollers 140_1~140_N are coupled to the addressing circuits 130_1~130_N, and are configured for generating corresponding address information by receiving and according to the corresponding address signals provided by the addressing circuits 130_1~130_N.

For convenience of illustration, the FCB 120_1 is taken as an example for illustration, and analogy may be performed on the other FCBs 120_2~120_N.

Figure 3:
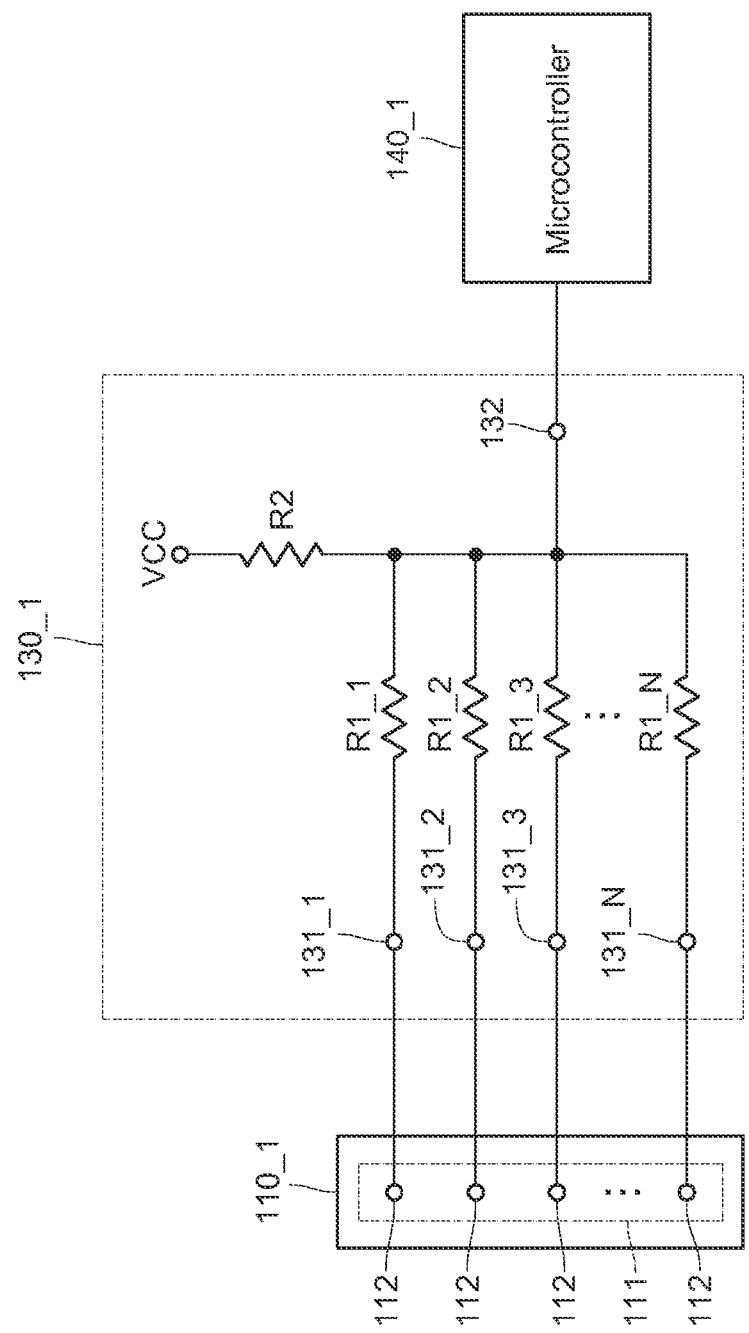
FIG. 3 is a detailed schematic view of an addressing circuit according to the disclosure.

Referring to FIG. 3, FIG. 3 is a detailed schematic view of the FCB 120_1 according to the disclosure. The FCB 120_1 comprises the addressing circuit 130_1 and the microcontroller 140_1. The addressing circuit 130_1 comprises a plurality of first connection ports 131_1~131_N, a plurality of first resistors R1_1~R1_N, a second resistor R2, and a second connection port 132.

The plurality of first connection ports 131_1~131_N are configured for being coupled to the plurality of connection terminals 112 of the corresponding connection unit 111, so that one of the plurality of first connection ports 131_1~131_N is coupled to the ground terminal 180. Taking the FCB 120_1 as an example, the first connection port 131_1 of the addressing circuit 130_1 is coupled to the ground terminal 180.

A plurality of first ends of the plurality of first resistors R1_1~R1_N are coupled to the plurality of first connection ports 131_1~131_N respectively. For example, the first ends of the plurality of first resistors R1_1~R1_N are coupled to the plurality of first connection ports 131_1~131_N in a one-to-one manner. In other words, the first end of the first resistor R1_1 is coupled to the first connection port 131_1, the first end of the first resistor R1_2 is coupled to the first connection port 131_2, . . . , and the first end of the first resistor R1_N is coupled to the first connection port 131_N. The plurality of first resistors R1_1~R1_N each have a different resistance value.

A first end of the second resistor R2 receives an operating voltage VCC, for example, P3V3. A second end of the second resistor R2 is coupled to second ends of the plurality of first resistors R1_1~R1_N, and is configured for generating an address signal. The second connection port 132 is coupled to the second end of the second resistor R2, and is configured for transmitting the address signal. In this embodiment, the second connection port 132 is a GPIO connection port. The microcontroller is coupled to the second connection port 132, and is configured for receiving the address signal, so as to generate corresponding address information.

First, when the FCB 120_1 is coupled to the power supply backplane 110_1, the plurality of first connection ports 131_1~131_N of the FCB 120_1 are coupled to the plurality of connection terminals 112 of the connection unit 111 of the power supply backplane 110_1 in a one-to-one manner. The first connection terminal 112 of the connection unit 111 of the power supply backplane 110_1 is coupled to the ground terminal 180. Hence, the operating voltage VCC is coupled to the ground terminal 180 through the second resistor R2 and the first resistor R1_1, thereby forming a loop.

Then, after the loop is formed, the addressing circuit 130_1 uses the second resistor R2 and the first resistor R1_1 to perform the voltage division on the operating voltage VCC, and the second end of the second resistor R2 generates a corresponding address signal. The address signal is, for example, a voltage drop at the first resistor R1_1. Then, the addressing circuit 130_1 transmits the address signal to the microcontroller 140_1 through the second connection port 132.

In this embodiment, when receiving the address signal generated by the addressing circuit 130_1, the microcontroller 140_1 defines an address of the FCB 120_1 in the rack server 100 according to the voltage drop corresponding to the address signal by looking up a look-up table. Thereby, an addressing operation is completed.

Furthermore, when the FCB 120_2 is coupled to the power supply backplane 110_2, the plurality of first connection ports 131_1~131_N of the FCB 120_2 are coupled to the plurality of connection terminals 112 of the connection unit 111 of the power supply backplane 110_2 in a one-to-one manner. The second connection terminal 112 of the connection unit 111 of the power supply backplane 110_2 is coupled to the ground terminal 180, so that the operating voltage VCC is coupled to the ground terminal 180 through the second resistor R2 and the first resistor R1_2, thereby forming a loop.

Then, after the loop is formed, the addressing circuit 130_2 uses the second resistor R2 and the first resistor R1_2 to perform the voltage division on the operating voltage VCC, and the second end of the second resistor R2 generates a corresponding address signal. In this embodiment, the address signal is a voltage drop at the first resistor R1_2. Then, the addressing circuit 130_2 transmits the address signal to the microcontroller 140_2 through the second connection port 132.

In this embodiment, when receiving the address signal generated by the addressing circuit 130_2, the microcontroller 140_2 defines an address of the FCB 120_2 in the rack server 100 according to the voltage drop corresponding to the address signal by searching a table. Thereby, an addressing operation is completed. Analogy may be performed for the addressing operation of the plurality of FCBs 120_3~120_N, which is therefore not repeated herein.

The addressing operation is performed on the plurality of FCBs 120_1~120_N, so that the plurality of FCBs 120_1~120_N have addresses thereof in the rack server 100. In this embodiment and some other embodiments, the addresses of the plurality of FCBs 120_1~120_N are provided for an RMC of the rack server 100, thereby making management and subsequent processing convenient.

In other words, when one of the plurality of FCBs 120_1~120_N is faulty, the microcontroller of the faulty FCB does not provide address information for the RMC. Thus, in this case the RMC can determine accordingly that which FCB is faulty, thereby making management and maintenance more convenient.

In the rack server according to the embodiment of the disclosure, when a plurality of first connection ports are coupled to the power supply backplane, one of the plurality of first connection ports is coupled to the ground terminal. The operating voltage, the second resistor, and the first resistor corresponding to the first connection port coupled to the ground terminal form a loop. Therefore, a corresponding address signal is generated. The microcontroller performs the corresponding addressing operation on the FCB in the rack server according to the address signal. Thereby, the use, management, and subsequent processing of the rack server are more convenient.

What is claimed is:

1. A rack server, comprising:
    a ground element having a plurality of protrusions, the plurality of protrusions being arranged on a same side of the ground element, and positions of the plurality of protrusions being different from each other;
    a plurality of power supply backplanes each having a connection unit, the connection unit having a plurality of connection terminals, the plurality of connection terminals each having a through hole, each of the power supply backplanes being coupled to the ground element, and one of the plurality of through holes of the plurality of connection terminals contacting one of the protrusions; and
    a plurality of fan controller boards configured for being coupled to one of the power supply backplanes respectively, each of the plurality of fan controller boards comprising:
    an addressing circuit coupled to the plurality of connection terminals of the corresponding connection unit, and configured for detecting a coupling relationship between the plurality of connection terminals and the ground element, so as to generate an address signal upon the coupling relationship between the plurality of connection terminals and the ground element; and
    a microcontroller coupled to the addressing circuit, and configured for receiving the address signal, so as to generate corresponding address information.

2. The rack server according to claim 1, wherein the addressing circuit comprises:
    a plurality of first connection ports, configured for being coupled to the plurality of connection terminals of the corresponding connection unit, so that one of the plurality of first connection ports is coupled to the ground element;
    a plurality of first resistors having first ends coupled to the plurality of first connection ports respectively, wherein each of the plurality of first resistors has a different resistance value;
    a second resistor having a first end for receiving an operating voltage and a second end coupled to second ends of the plurality of first resistors, and configured for generating the address signal; and
    a second connection port coupled to the second end of the second resistor, and configured for transmitting the address signal.

3. The rack server according to claim 2, wherein the second connection port is a general purpose input output connection port.

4. The rack server according to claim 1, wherein the ground element is a housing of the rack server.

5. The rack server according to claim 1, wherein the ground element is a ground portion of a power supply unit of the rack server.

* * * * *